(12) United States Patent
Basu et al.

(10) Patent No.: US 9,324,853 B2
(45) Date of Patent: Apr. 26, 2016

(54) III-V SEMICONDUCTOR DEVICE HAVING SELF-ALIGNED CONTACTS

(71) Applicant: International Business Machines Corporation, Armonk, NY (US)

(72) Inventors: Anirban Basu, Lagrangeville, NY (US); Amlan Majumdar, White Plains, NY (US); Kuen-Ting Shiu, Yorktown Heights, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/793,772

(22) Filed: Jul. 8, 2015

(65) Prior Publication Data

US 2015/0325650 A1 Nov. 12, 2015

Related U.S. Application Data

(62) Division of application No. 14/187,708, filed on Feb. 24, 2014, now Pat. No. 9,159,822.

(51) Int. Cl.
*H01L 29/66* (2006.01)
*H01L 29/778* (2006.01)
(Continued)

(52) U.S. Cl.
CPC ...... *H01L 29/7787* (2013.01); *H01L 21/02455* (2013.01); *H01L 21/02538* (2013.01);
(Continued)

(58) Field of Classification Search
CPC ............ H01L 29/7787; H01L 29/1033; H01L 29/205
USPC .................................................. 257/194, 197
See application file for complete search history.

(56) References Cited

U.S. PATENT DOCUMENTS 6,306,713 B1 10/2001 Hu et al.
6,348,379 B1 2/2002 Wang et al.
(Continued)

OTHER PUBLICATIONS

Shinohara et al., "547-GHz ft In0.7Ga0.3As-In0.52Al0.48As HEMTs With Reduced Source and Drain Resistance", IEEE Electron Device Letters, vol. 25, No. 5, May 2004, pp. 241-243.
(Continued)

*Primary Examiner* — Long K Tran
(74) *Attorney, Agent, or Firm* — L. Jeffrey Kelly; Louis J. Percello

(57) ABSTRACT

A method including forming a pair of inner spacers along a vertical sidewall of a gate trench, gate trench extending into a III-V compound semiconductor-containing heterostructure, forming a gate conductor within the gate trench, removing a portion of a first dielectric layer selective to the gate conductor and the pair of inner spacers, forming a pair of outer spacers adjacent to the pair of inner spacers, the outer spacers are in direct contact with and self-aligned to the inner spacers, and forming a pair of source-drain contacts within an uppermost layer of the III-V compound semiconductor-containing heterostructure, the pair of source-drain contacts are self-aligned to the pair of outer spacers such that an edge of each individual source-drain contact is aligned with an outside edge of each individual outer spacer.

7 Claims, 13 Drawing Sheets

(51) Int. Cl.
*H01L 29/423* (2006.01)
*H01L 21/285* (2006.01)
*H01L 21/762* (2006.01)
*H01L 29/06* (2006.01)
*H01L 29/10* (2006.01)
*H01L 21/02* (2006.01)
*H01L 29/205* (2006.01)
*H01L 29/417* (2006.01)

(52) U.S. Cl.
CPC ....... *H01L 21/28575* (2013.01); *H01L 21/762* (2013.01); *H01L 29/0649* (2013.01); *H01L 29/1033* (2013.01); *H01L 29/205* (2013.01); *H01L 29/4236* (2013.01); *H01L 29/42364* (2013.01); *H01L 29/6656* (2013.01); *H01L 29/66462* (2013.01); *H01L 29/66522* (2013.01); *H01L 29/66553* (2013.01); *H01L 29/66621* (2013.01); *H01L 29/778* (2013.01); *H01L 29/7784* (2013.01); *H01L 29/41775* (2013.01); *H01L 29/42316* (2013.01)

(56) References Cited

U.S. PATENT DOCUMENTS

| | | | |
|---|---|---|---|
| 7,126,198 | B2 | 10/2006 | Steiner et al. |
| 7,332,775 | B2 | 2/2008 | Steiner et al. |
| 7,466,010 | B2 | 12/2008 | Ahlgren et al. |
| 8,436,404 | B2 | 5/2013 | Bohr et al. |
| 2007/0267691 | A1* | 11/2007 | Chen ................. H01L 21/28061 257/330 |
| 2008/0203486 | A1 | 8/2008 | Wiatr et al. |
| 2009/0035901 | A1* | 2/2009 | Lin ................... H01L 27/10823 438/243 |
| 2010/0320509 | A1 | 12/2010 | Knorr et al. |
| 2011/0147713 | A1 | 6/2011 | Pillarisetty et al. |
| 2015/0021662 | A1 | 1/2015 | Basu et al. |

OTHER PUBLICATIONS

Pending U.S. Appl. No. 14/187,708, entitled: "III-V Semiconductor Device Having Self-Aligned Contacts", filed Feb. 24, 2014, 38 pages.

* cited by examiner

III-V SEMICONDUCTOR DEVICE HAVING SELF-ALIGNED CONTACTS

BACKGROUND

The present invention generally relates to semiconductor structures, and more particularly to a III-V semiconductor field-effect transistor structure having a gate dielectric and self-aligned source-drain contacts.

Compound semiconductors are receiving renewed attention for use as channel materials for advanced ultra large scale integration (ULSI) digital logic applications due to their high electron mobility. For example, the InGaAs/InAlAs material system is one of the most promising material systems for this application due to its large conduction-band offsets and high electron mobility. Schottky-gated InGaAs high electron mobility transistors (HEMTs) grown on InP substrates have produced maximum transconductance $g_m$ values over 2 S/mm and have been shown to compare favorably in terms of a power-delay product.

SUMMARY

According to one embodiment of the present invention, a method is provided. The method may include forming a pair of inner spacers along a vertical sidewall of a gate trench, the gate trench extending from a top surface of a first dielectric layer down to a channel layer of a III-V compound semiconductor-containing heterostructure, the first dielectric layer is above the III-V compound semiconductor-containing heterostructure, forming a gate conductor within the gate trench, and removing a portion of the first dielectric layer selective to the gate conductor, the pair of inner spacers, and the III-V compound semiconductor-containing heterostructure. The method may further include forming a pair of outer spacers adjacent to the pair of inner spacers and above the III-V compound semiconductor-containing heterostructure, the outer spacers are in direct contact with and self-aligned to the inner spacers, and forming a pair of source-drain contacts within an uppermost layer of the III-V compound semiconductor-containing heterostructure, the pair of source-drain contacts are self-aligned to the pair of outer spacers such that an edge of each individual source-drain contact is aligned with an outside edge of each individual outer spacer.

According to another embodiment of the present invention, a method is provided. The method may include forming a first dielectric layer on top of a III-V compound semiconductor-containing heterostructure, forming an isolation region in the first dielectric layer and in the III-V compound semiconductor-containing heterostructure, the isolation at least partially surrounds an active region within the III-V compound semiconductor-containing heterostructure, and forming a gate trench in the active region of the III-V compound semiconductor-containing heterostructure, the gate trench extending from a top surface of the first dielectric layer down to a channel layer of the III-V compound semiconductor-containing heterostructure. The method may further include forming a pair of inner spacers along a vertical sidewall of the gate trench, forming a gate dielectric and a gate conductor within the gate trench, the gate conductor is located on top of the gate dielectric, and removing a portion of the first dielectric layer selective to the gate conductor, the gate dielectric, the pair of inner spacers, and the III-V compound semiconductor-containing heterostructure. The method may further include forming a pair of outer spacers adjacent to the pair of inner spacers and above the III-V compound semiconductor-containing heterostructure, the outer spacers are in direct contact with and self-aligned to the inner spacers and forming a pair of source-drain contacts within an uppermost layer of the III-V compound semiconductor-containing heterostructure, the pair of source-drain contacts are self-aligned to the pair of outer spacers such that an edge of each individual source-drain contact is aligned with an outside edge of each individual outer spacer.

According to another embodiment of the present invention, a structure is provided. The structure may include a gate conductor partially embedded in a III-V compound semiconductor-containing heterostructure, the gate conductor extending from above the III-V compound semiconductor-containing heterostructure down into the III-V compound semiconductor-containing heterostructure, a pair of inner spacers positioned along a vertical sidewall of the gate conductor between the gate conductor and the III-V compound semiconductor-containing heterostructure, a pair of outer spacers adjacent to the pair of inner spacers above the III-V compound semiconductor-containing heterostructure, the outer spacers are in direct contact with and self-aligned to the inner spacers, and a pair of source-drain contacts positioned within the III-V compound semiconductor-containing heterostructure, the pair of source-drain contacts are self-aligned to the pair of outer spacers such that an edge of each individual source-drain contact is aligned with an outside edge of each individual outer spacer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
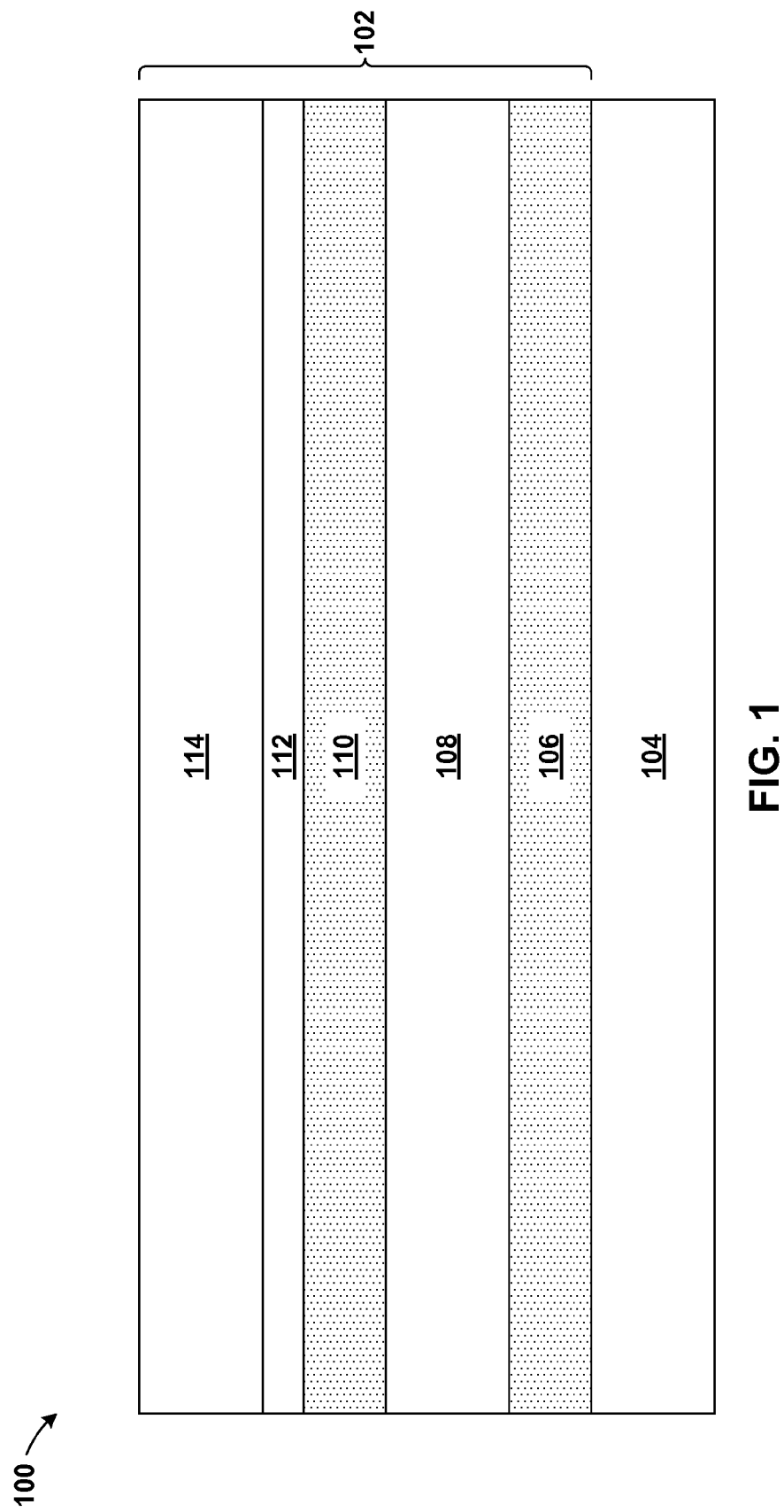
FIG. 1 is a cross-sectional view of a semiconductor heterostructure formed on top of a substrate according to an exemplary embodiment.

Detailed embodiments of the claimed structures and methods are disclosed herein; however, it is understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In one embodiment, a semiconductor structure such as a III-V semiconductor field-effect transistor device (hereinafter "III-V device") with a gate dielectric and having fully self-aligned source-drain contacts can be fabricated. One embodiment by which to fabricate the III-V device with the gate dielectric and fully self-aligned source-drain contacts is described in detail below by referring to the accompanying drawings FIGS. 1-13. In the present embodiment, the self-aligned source-drain contacts of the III-V device may be fully self-aligned to a pair of outer spacers formed on opposite sides of a gate conductor.

Referring now to FIG. 1, a structure 100 including a III-V compound semiconductor-containing heterostructure 102 (hereinafter "heterostructure 102") formed on top of a substrate 104 is shown. The heterostructure 102 may include a III-V compound semiconductor buffer layer 106 (hereinafter "buffer layer 106"), a III-V compound semiconductor channel layer 108 (hereinafter "channel layer 108"), and a III-V compound semiconductor barrier layer 110 (hereinafter "barrier layer 110"). The buffer layer 106 may be above the substrate 104 and have a first bandgap. The channel layer 108 may be above the buffer layer 106 and have a second bandgap. The barrier layer 110 may be above the channel layer 108 and have a third bandgap.

In the present embodiment, the term "III-V compound semiconductor" may denote a semiconductor material that includes at least one element from Group III of the Periodic Table of Elements and at least one element from Group V of the Periodic Table of Elements. Typically, each of the III-V compound semiconductor layers is a binary, ternary or quaternary III-V containing compound. Examples of III-V compound semiconductors that can be used in the present invention include, but are not limited to alloys of InGaAs, InAlAs, InAlAsSb, InAlAsP and InGaAsP.

In the present embodiment, the barrier layer 110 may include a delta doped region (not shown) that is located in a lower region of barrier layer 110 adjacent to, but not in direct contact with, the interface between the barrier layer 110 and the underlying channel layer 108. The delta doped region may include an n-type dopant (for example, an element from Group IV or VI of the Periodic Table of Elements) or a p-type dopant (for example, an element from Group II or IV of the Periodic Table of Elements). The dopant concentration within the delta doped region may typically range from about $10^{11}$ to about $10^{15}$ atoms/cm$^2$, with a dopant concentration within the delta doped region ranging from about $10^{11}$ to about $10^{13}$ atoms/cm$^2$ being even more typical.

The substrate 104 illustrated in the present embodiment may include any semiconductor material including, for example, Si, SiGe, SiGeC, SiC, Ge alloys, Ga, GaAs, InAs, InP, Ge and all other III-V compound semiconductors. The substrate 104 may include a layered semiconductor material such as, for example, a semiconductor-on-insulator. The substrate 104 may be doped, undoped or contain doped and undoped regions therein. The substrate 104 may have a single crystal orientation or it may have surface regions that have different crystal orientations. The substrate 104 may be strained, unstrained or a combination thereof.

In accordance with the present embodiment, the bandgap of the barrier layer 110 (for example, the third bandgap) may be larger (wider) than the bandgap of the channel layer 108 (for example, the second bandgap). As stated above, the term "bandgap" refers to the energy difference between the top of the valence band (i.e., $E_V$) and the bottom of the conduction band (i.e., $E_C$). Typically, the barrier layer 110 may include a III-V compound semiconductor having a bandgap value ranging from about 0.5 to about 10 times larger than the bandgap of the III-V compound semiconductor material used in the channel layer 108. More typically, the barrier layer 110 may include a III-V compound semiconductor having a bandgap value ranging from about 1 to about 5 times larger than the bandgap of the III-V compound semiconductor material used in the channel layer 108.

The bandgap of the buffer layer 106 (for example, the first bandgap) may also be larger than that of the channel layer 108; this may help to confine the electrons within the channel layer 108 as well. Typically, the buffer layer 106 may include a III-V compound semiconductor having a bandgap value ranging from about 0.5 to about 10 times larger than the bandgap of the III-V compound semiconductor material used in the channel layer 108. More typically, the buffer layer 106 may include a III-V compound semiconductor having a bandgap value ranging from about 1 to about 5 times larger than the bandgap of the III-V compound semiconductor material used in the channel layer 108.

It should be noted that the bandgap of the buffer layer 106 and the bandgap of the barrier layer 110, which may be larger than the bandgap of the channel layer 108, may not necessarily have the same value.

Since wide bandgap materials may be used for the buffer layer 106 and the barrier layer 110, and a narrow bandgap material may be used for the channel layer 108, carriers may be confined to the channel layer 108 under certain gate bias ranges. Typically, the carriers may be confined in the channel layer 108 when typical gate bias conditions are applied.

In one embodiment, the buffer layer 106 and the barrier layer 110 may include an alloy of InAlAs, while the channel layer 108 may include an alloy of InGaAs. By "alloy of InAlAs" it is meant a composition of $In_xAl_{1-x}As$ wherein x is from about 0 to about 1, and more preferably from about 0.4 to about 0.6. In another embodiment, x is 0.52. By "alloy of InGaAs" it is meant a composition of $In_yGa_{1-y}As$ wherein y is from about 0 to about 1, and more preferably y may range from about 0.3 to about 0.8. In another embodiment, y is 0.7.

It should be noted that each of the III-V compound semiconductor layers used in the present embodiment may include a single crystal material of typical commercial quality. By "typical commercial quality" it is meant that each of the III-V compound semiconductor layers may have a defect density on the order of about $10^5$ atoms/cm$^2$ or less, with a defect density of less than about 5000 atoms/cm$^2$ being more typical. The typical commercial quality of the III-V compound semiconductor layers is a result of utilizing an epitaxial growth process such as, for example, molecular beam epitaxy (MBE) or metal-organic chemical vapor deposition (MOCVD). That is, each of the III-V compound semiconductor layers may be formed by an epitaxial growth process that produces a high quality, single crystal III-V film. The deposition of each of the III-V compound semiconductor layers of the preset embodiment may be performed in the same or different apparatus. Moreover, each of the III-V compound semiconductor layers can be formed without breaking vacuum during the deposition of each of the layers. Alternatively, vacuum may be broken during the formation of an individual III-V compound semiconductor layer.

The III-V compound semiconductors may be epitaxially grown utilizing III/V-containing precursors that are well known to those skilled in the art. When the vacuum between the deposition of each of the III—V layers is not broken, the precursors can be switched to provide the next layer. In some embodiments, a graded III-V compound semiconductor layer can be formed.

When the delta doped region is formed into the lower region of the barrier layer 110, an in-situ doping deposition process can be used in which the dopant atom is introduced during the initial formation of the barrier layer and following the formation of a desired thickness of the delta doped region (typically on the order of about 0.1 to about 2.0 nm), the dopant is removed from the precursor stream and the barrier layer 110 formation continues. Alternatively, the delta doped region can be formed using ion implantation after the barrier layer 110 has been formed. The conditions of such an implant may be selected to provide a delta doped region adjacent to, but not in contact with, the interface between the barrier layer 110 and the underlying channel layer 108.

Each of the individual III-V compound semiconductor layers shown in FIG. 1 are relatively thin (providing a total thickness of less than 600 nm). Typically, the buffer layer 106 may have a thickness ranging from about 25 nm to about 500 nm, with a thickness ranging from about 100 nm to about 300 nm being even more typical. The channel layer 108 may have a thickness ranging from about 1 nm to about 15 nm, with a thickness ranging from about 5 nm to about 10 nm being even more typical. The thickness of the barrier layer 110 may range from about 0.1 nm to about 10 nm, with a thickness from about 0.5 nm to about 10 nm being even more typical.

With continued reference to FIG. 1, the hetero structure 102 may further include a III-V compound semiconductor contact layer 114 (hereinafter "contact layer 114") above the barrier layer 110. It should be noted that the contact layer 114 may be optional. The contact layer 114 may be, but not always necessarily, a doped layer. The dopant within the contact layer 114 can be an n-type dopant or a p-type dopant, with an n-type dopant being more typical for an n-channel MOSFET. Unlike the delta doped region of the barrier layer 110 described above, the doping within the contact layer 114 may be evenly distributed throughout the entire vertical thickness of the layer. The dopant concentration within the contact layer 114 may typically range from about $10^{17}$ to about $10^{21}$ atoms/cm$^2$, with a dopant concentration within the contact layer 114 ranging from about $10^{18}$ to about $10^{20}$ atoms/cm$^2$ being more typical.

The contact layer 114 may include the same or different III-V compound semiconductor as the channel layer 108. In one embodiment, the contact layer 114 may include the same III-V compound semiconductor elements, but a different alloy composition, as the channel layer 108 except for the presence of dopants within the contact layer 114.

The contact layer 114 may also include a single crystal material of typical commercial quality since the contact layer 114 may be formed using an epitaxial growth process such as MBE or MOCVD. The doping of the contact layer 114 may typically occur during the deposition of the contact layer 114. Alternatively, the dopants can be introduced into the contact layer 114 post deposition by ion implantation or outdiffusion from a doped layer that is formed atop the contact layer 114. The thickness of the contact layer 114 may range from about 5 nm to about 50 nm, with a thickness ranging from about 15 nm to about 30 nm being even more typical.

In one embodiment, the buffer layer 106 and the barrier layer 110 may include an alloy of InAlAs, while the channel layer 110 and the contact layer 114 may include an alloy of InGaAs. The contact layer 114 may be heavily doped with an n-type dopant. By "alloy of InAlAs" it is meant a composition of $In_xAl_{1-x}As$ wherein x ranges from about 0 to about 1, and more preferably ranging from about 0.4 to about 0.6. In another embodiment, x is 0.52. By "alloy of InGaAs" it is meant a composition of $In_yGa_{1-y}As$ wherein y ranges from about 0 to about 1, and more preferably y ranges from about 0.3 to about 0.8. In one embodiment, y is 0.7.

In yet another embodiment, an etch stop layer 112 may be included in the heterostructure 102. The etch stop layer 112 may be positioned between the barrier layer 110 and the contact layer 114. Since the barrier layer 110 and the contact layer 114 may in some embodiments include the same or substantially similar materials, the etch stop layer 112 may be used to distinguish between the barrier layer 110 and the contact layer 114 during subsequent etching techniques. The etch stop layer 112 may include any suitable etch stop material known in the art. A suitable etch stop material may include any material that which has a different etch rate than the materials of either the barrier layer 110 or the contact layer 114.

Figure 2:
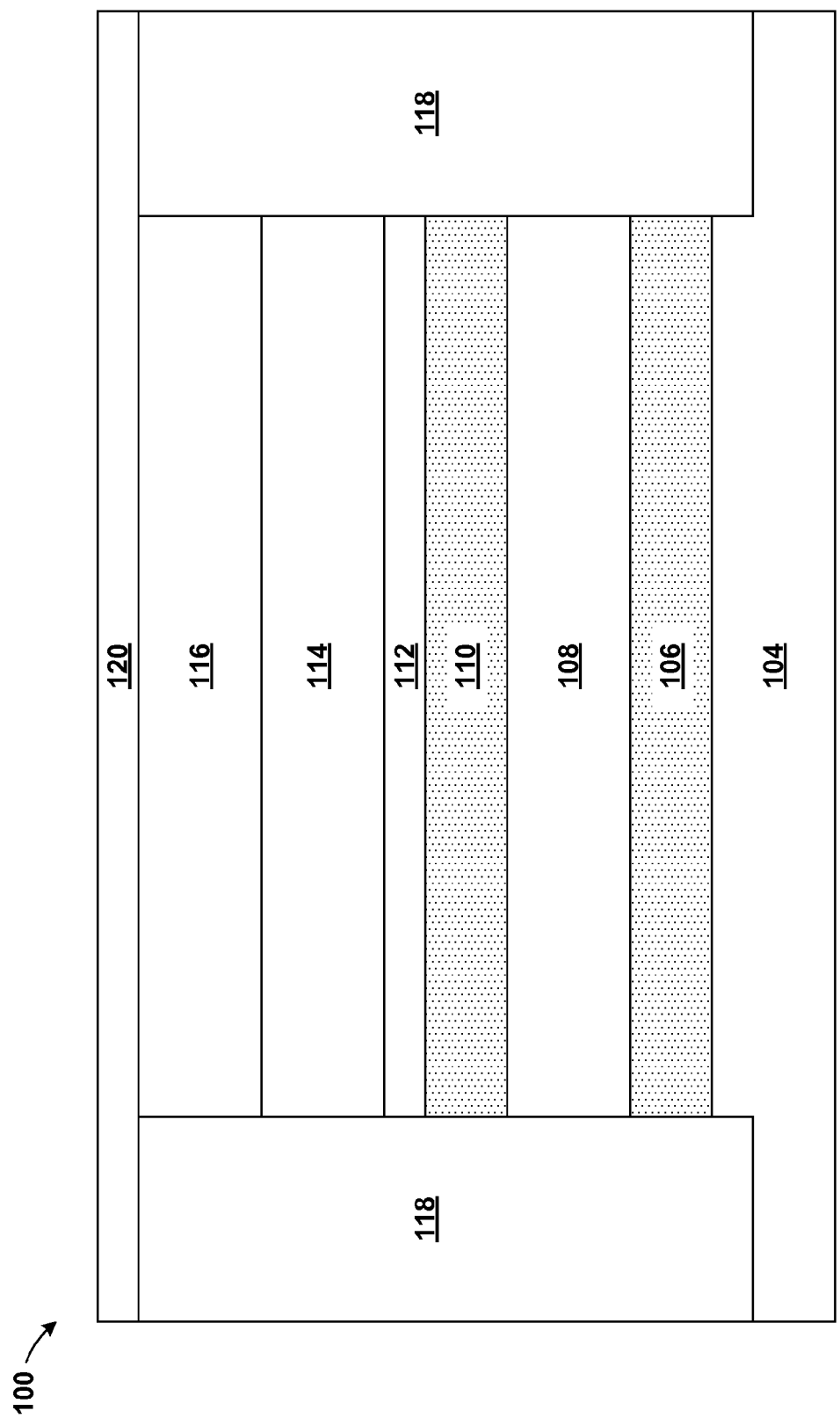
FIG. 2 is a cross-sectional view that illustrates forming a first dielectric layer, a second dielectric layer above the semiconductor heterostructure, and forming an isolation region in the semiconductor heterostructure according to an exemplary embodiment.

Referring now to FIG. 2, a first dielectric layer 116 may be formed above the heterostructure 102, on top of the contact layer 114. The first dielectric layer 116 may include any suitable dielectric or insulator material known in the art deposited using known techniques. In one embodiment, the first dielectric layer 116 may include, for example, an oxide or a nitride. The first dielectric layer 116 may also be referred to as an inter-level dielectric. The thickness of the first dielectric layer 116 may range from about 10 nm to about 50 nm, with a thickness ranging from about 15 nm to about 30 nm being even more typical.

Next, multiple isolation regions can be formed in the structure 100 to electrically isolate adjacent active regions. For example, isolation regions 118 can be formed in the heterostructure 102 to define an active region and electrically insulate any semiconductor device which maybe subsequently formed in the active region. The isolation regions 118 can be formed using typical shallow trench isolation techniques well known to a person of ordinary skill in the art including, for example, forming a patterned mask on the surface of the substrate via lithography, etching a trench into the substrate through an opening in the patterned mask, and filling the trench with a trench dielectric such as $SiO_2$ or TEOS and planarizing the structure using chemical mechanical polish. An optional trench liner (not shown) can be formed within the trench prior to filling the trench and an optional densification step may follow the planarization process.

A second dielectric layer 120 can then be formed above the heterostructure 102, on top of the first dielectric layer 116, and above the isolation regions 118, as illustrated. The second dielectric layer 120 may include any suitable dielectric or insulator material known in the art deposited using known techniques. In one embodiment, the second dielectric layer 120 may include, for example, an oxide or a nitride. The thickness of the second dielectric layer 120 can range from about 10 nm to about 50 nm, with a thickness ranging from about 15 nm to about 30 nm being even more typical.

It should be noted that the structure 100 can be optionally fabricated without the second dielectric layer 120; however, the second dielectric layer 120 offers some etch selectivity advantages during subsequent fabrication steps, as will be described in more detail below. Furthermore, the first dielectric layer 116, the isolation regions 118, and the second dielectric layer 120 can each be composed of the same dielectric material or a different dielectric material.

Figure 3:
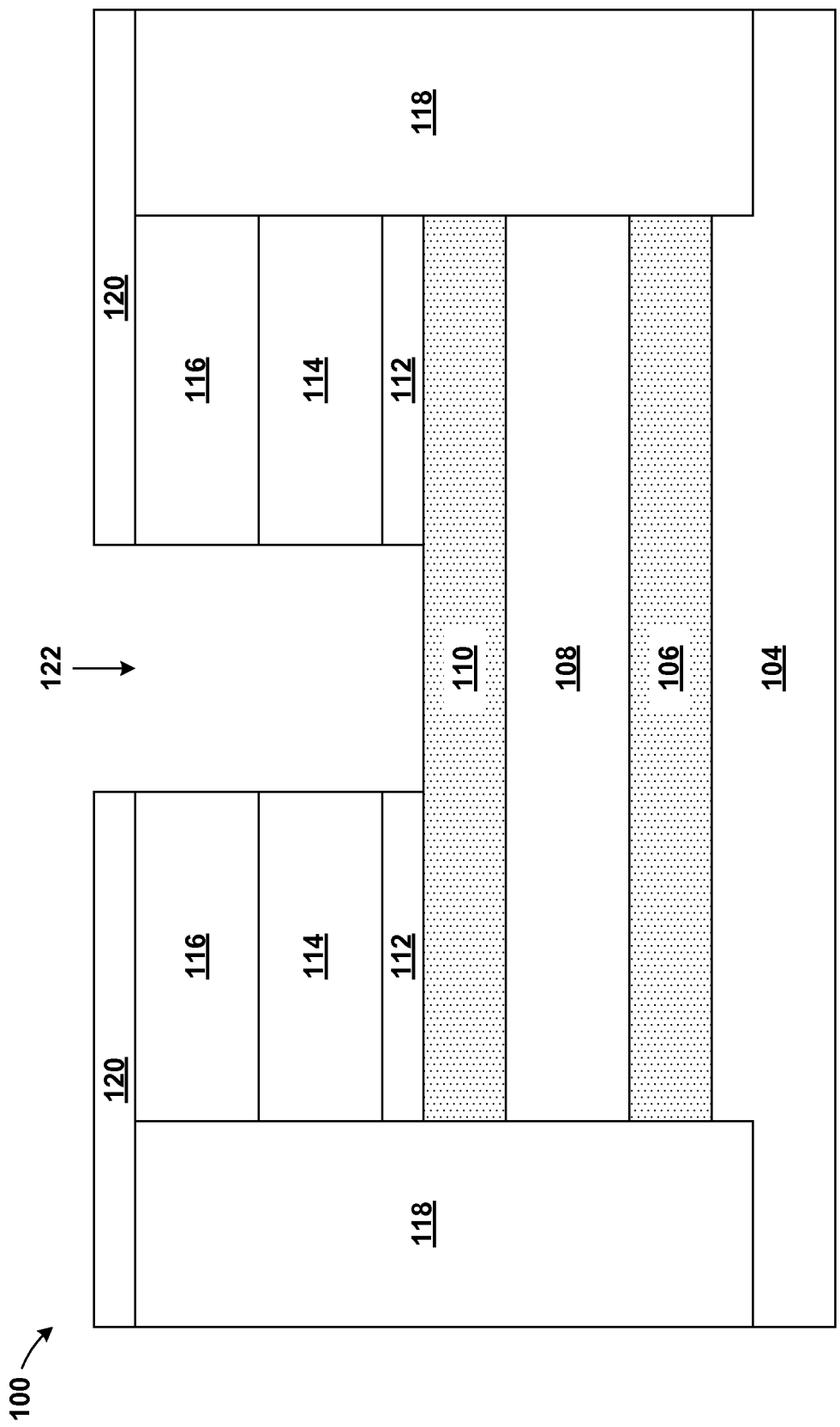
FIG. 3 is a cross-sectional view that illustrates forming a gate trench in the semiconductor heterostructure according to an exemplary embodiment.

Referring now to FIG. 3, a gate trench 122 may be patterned in the structure 100 using optical lithography techniques known in the art. More specifically, the gate trench 122 may be formed by removing a portion of each of the second dielectric layer 120, the first dielectric layer 116, the contact layer 114, and the etch stop layer 112, as shown. In one embodiment, a reactive ion etching technique may be used to form the gate trench 122. Etching chemistries may be switched in order to remove portions of each of the layers listed above. In the present embodiment, the final chemistry chosen will preferably etch or remove a portion of the etch stop layer 112 selective to the barrier layer 110. The depth of the gate trench 122 may vary, as described in alternative embodiments discussed below with reference to FIGS. 11, 12, and 13.

Figure 4:
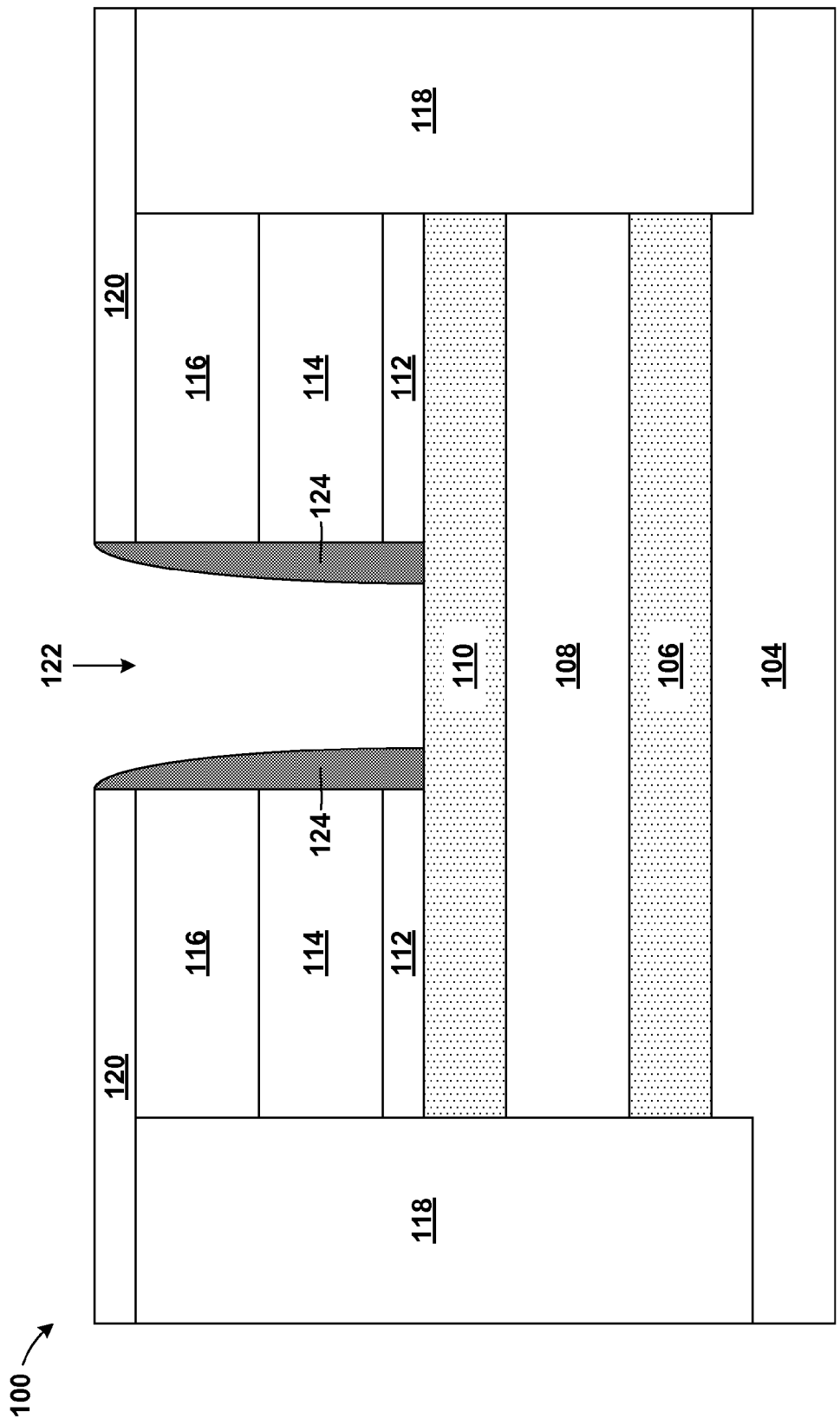
FIG. 4 is a cross-sectional view that illustrates forming inner spacers within the gate trench according to an exemplary embodiment.

Referring now to FIG. 4, a pair of inner spacers 124 (hereinafter "inner spacers") may be formed along opposite vertical sidewalls of the gate trench 122, as illustrated. The inner spacers 124 may be formed by conformally depositing a dielectric material, followed by an anisotropic etch that removes the dielectric material from the horizontal surfaces of the structure 100, for example a top surface of the second dielectric layer 120 and a top surface of the barrier layer 110, while leaving it on the sidewalls of the gate trench 122. In one embodiment, the inner spacers 124 may be composed of any suitable dielectric material, such as, for example, a nitride or an oxide. In an embodiment, the inner spacers 124 may be composed of silicon nitride. In another embodiment, the inner spacers 124 may have a horizontal width, or thickness, ranging from about 5 nm to about 30 nm. In one embodiment, the inner spacers 124 may include a dielectric material having positive etch selectivity from the chosen dielectric material of the first dielectric layer 116. More specifically, the inner spacers 124 may include a dielectric material that which may be removed selective to the chosen dielectric material of the first dielectric layer 116.

The inner spacers 124 may include a single layer; however, the inner spacers 124 may include multiple layers of dielectric material. The inner spacers 124 may be positioned along the vertical sidewalls of the gate trench 122 and separate the second dielectric layer 120, the first dielectric layer 116, the contact layer 114, and the etch stop layer 112 from a subsequently formed gate conductor.

Figure 5:
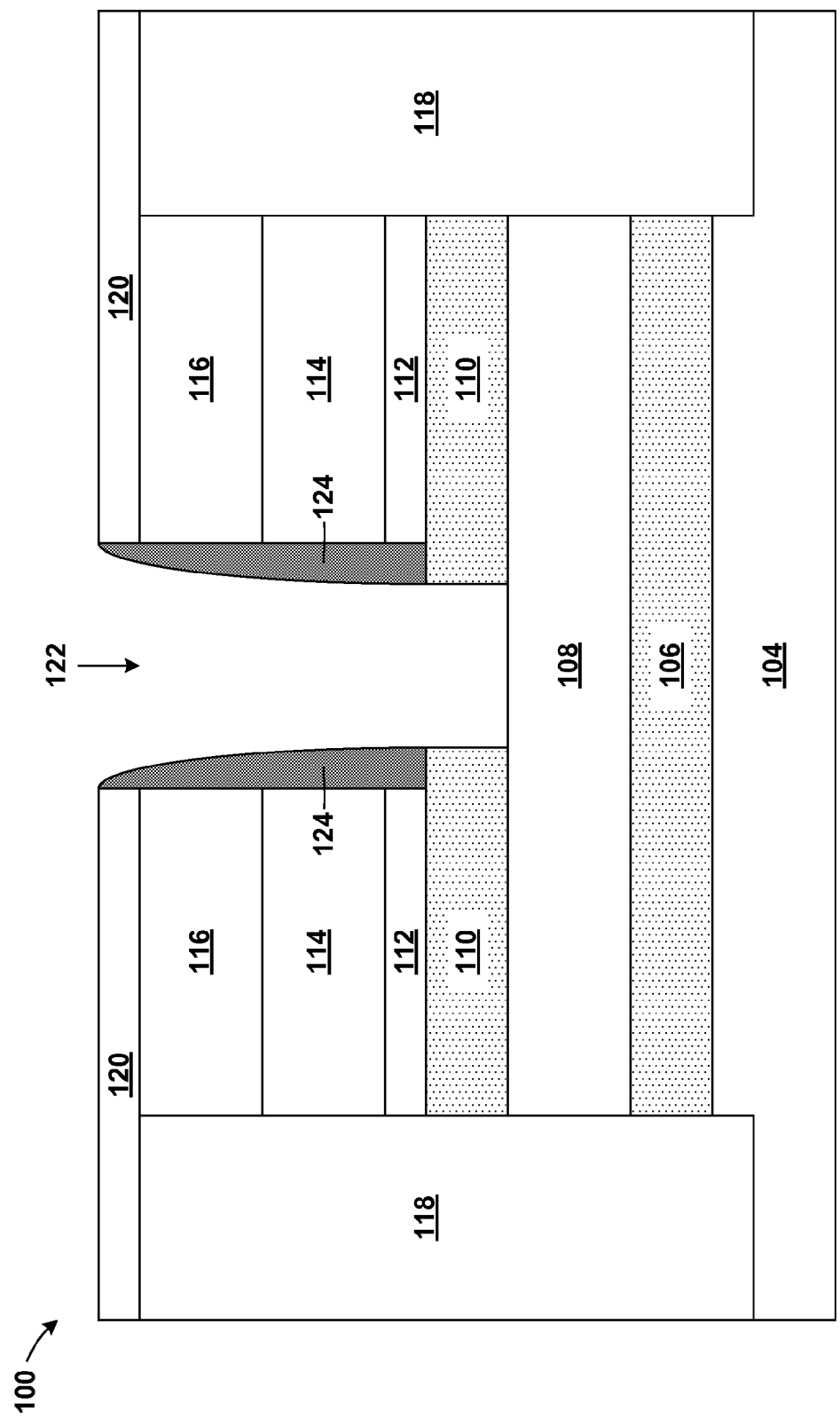
FIG. 5 is a cross-sectional view that illustrates the removal of a portion of a barrier layer at the bottom of the gate trench according to an exemplary embodiment.

Referring now to FIG. 5, a portion of the barrier layer 110 may be removed from a bottom of the gate trench 122, as illustrated. The portion of the barrier layer 110 may be removed using any suitable etching technique known in the art. A suitable etching technique may include any anisotropic etching technique, such as, for example, reactive ion etching. The chosen etching technique and corresponding etch chemistry may preferably etch the barrier layer 110 selective to the channel layer 108, as illustrated. In some embodiments, the present step may be omitted. See FIGS. 11, 12 and 13.

Figure 6:
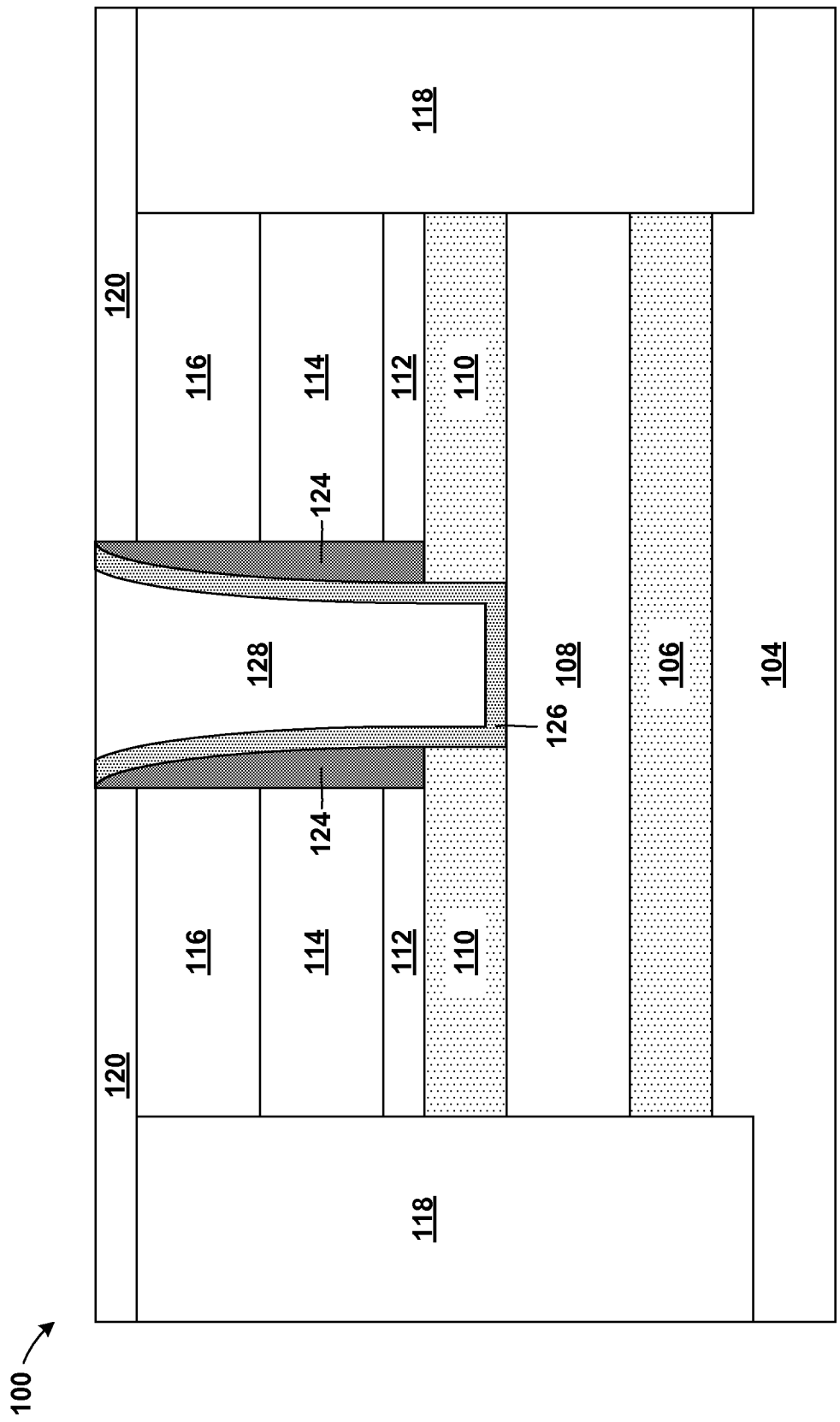
FIG. 6 is a cross-sectional view that illustrates the formation of a gate dielectric and a gate metal according to an exemplary embodiment.

Referring now to FIG. 6, a gate dielectric 126 and a metal gate, or otherwise referred to as a gate conductor 128, may be formed within the gate trench 122 (FIG. 5), as illustrated. First, the gate dielectric 126 may be conformally deposited on the structure 100, including within the gate trench 122 (FIG. 5). The gate dielectric 126 may be formed using any known conventional deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The gate dielectric 126 of the present embodiment may have a dielectric constant greater than 4.0; such a dielectric material may be referred to as a high-k dielectric. Typically, the gate dielectric 126 may have a dielectric constant of about 7.0 or greater, with a dielectric constant of about 10.0 or greater being even more typical. The dielectric constants mentioned herein are relative to a vacuum, unless otherwise stated. Specifically, the gate dielectric 126 of the present embodiment may include, but is not limited to, an oxide, nitride, oxynitride or silicates including metal silicates, aluminates, titanates and nitrides. In one embodiment, the gate dielectric 126 may include $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_x$, $HfAlO_x$ or HfAlO$_a$N$_b$. In one embodiment, the gate dielectric 126 may be a Hf-based dielectric material.

The thickness of the gate dielectric 126 may vary depending on the deposition technique used as well as the composition and number of layers of the gate dielectric 126. Typically, the gate dielectric 126 may have a thickness ranging from about 0.5 nm to about 20 nm, with a thickness ranging from about 1 nm to about 10 nm being preferred, and a thickness ranging from about 1 nm to about 5 nm being most preferred.

Next, the gate conductor 128 may be conformally deposited on the structure 100, including above gate dielectric 126 and within the gate trench 122 (FIG. 5). The gate conductor 128 may be formed using any known conventional deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The gate conductor 128 of the present invention may include any conductive material such as, for example, polysilicon, polysilicon germanium, conductive metals, conductive metal alloys, conductive silicides, conductive nitrides and combinations or multi-layers thereof. When metallic-containing gate conductors are used, the metallic gate conductor can be doped so as to shift the work function of the gate conductor. Illustrative examples of dopant ions include arsenic (As), phosphorous (P), boron (B), antimony (Sb), bismuth (Bi), aluminum (Al), gallium (Ga), titanium (Ti) or mixtures thereof. The same dopants may also be used with polysilicon or polysilicon-germanium mentioned above. Preferably, the gate conductor 128 may be a conductive metal, with aluminum (Al), platinum (Pt), gold (Au), tungsten (W), titanium (Ti), and titanium nitride (TiN) being highly preferred. The selection of a metal gate conductor is advantageous since conductive metals have different work functions that permit one to adjust the threshold voltage of the device. The gate conductor 128 may be formed by a conventional deposition process such as, for example, chemical vapor deposition (CVD), plasma enhanced chemical vapor deposition (PECVD), physical vapor deposition (PVD), plating, thermal or electron-beam evaporation and sputtering. In some embodiments, the gate conductor 128 may include a single layer or multiple layers of any of the conductive materials described above.

After deposition, excess material of both the gate dielectric 126 and the gate conductor 128, may be removed such that a top of the gate conductor 128 is substantially flush with a top of the second dielectric layer 120. In an embodiment, a chemical mechanical polishing technique, stopping on the second dielectric layer 120, may be used to remove the excess gate conductor material. The chosen polishing technique may also simultaneously remove excess material of the gat dialectic 126. In some embodiments, the gate conductor 128 and the gate dielectric 126 may each be removed with a different polishing technique. In embodiments without the second dielectric layer 120, the chosen polishing technique may be designed to stop on both the first dielectric layer 116 and the isolation regions 118.

Figure 7:
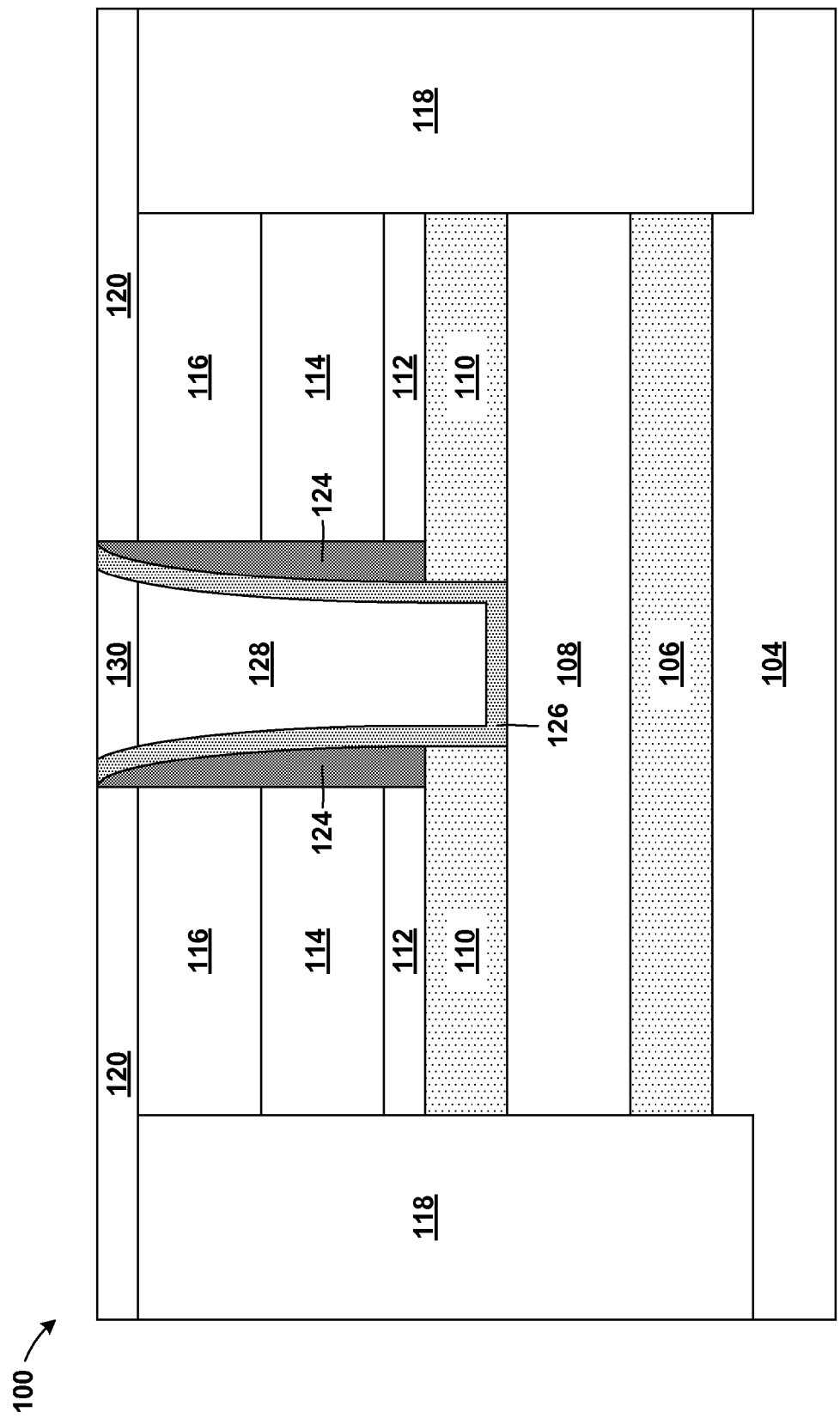
FIG. 7 is a cross-sectional view that illustrates the formation of a gate cap according to an exemplary embodiment.

Referring now to FIG. 7, a portion of the gate conductor 128 may be removed and subsequently replaced with a gate cap 130. The gate cap 130 may be any oxide, nitride, oxynitride or any combination thereof. The gate cap 130 can be made of a similar or different dielectric material than the inner spacers 124. In one embodiment, the gate cap 130 may be a nitride such as, for example, Si$_3$N$_4$. In one embodiment, the gate cap 130 may be an oxide, such as, for example, SiO$_2$.

Preferably, the gate cap 130 may have a vertical thickness ranging from about 10 nm to about 100 nm. More preferably the gate cap 130 may have a thickness ranging from about 20 nm to about 50 nm. In an embodiment, where the gate conductor 128 may be made from a silicon-containing material, a gate cap may not be required to form a silicide contact on the gate conductor. However, in an embodiment, where the gate conductor 128 may be made from a material which does not contain silicon, the gate cap 130 may be required to prevent a silicide contact on the gate conductor 128.

Figure 8:
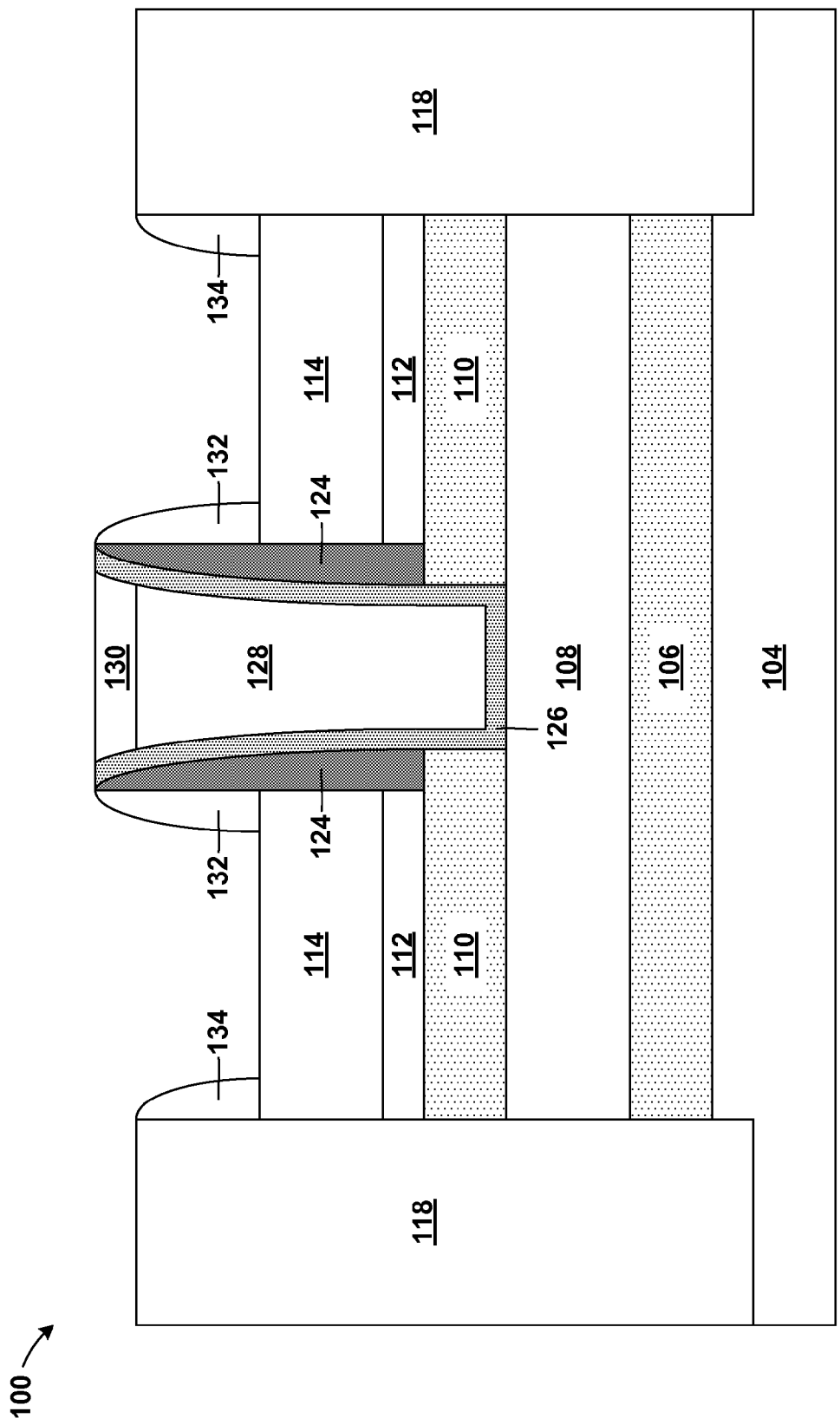
FIG. 8 is a cross-sectional view that illustrates removing the first and second dielectric layers and the formation of a pair of outer spacers and a pair of parasitic spacers according to an exemplary embodiment.

Referring now to FIG. 8, the second dielectric layer 120 and the first dielectric layer 116 may be removed as illustrated. The first dielectric layer 116 and the second dielectric layer 120 may be removed using any suitable etching technique known in the art. A suitable etching technique may include any anisotropic etching technique, such as, for example, reactive ion etching. The chosen etching technique and corresponding etch chemistry may preferably etch the first dielectric layer 116 selective to the gate cap 130, the gate dielectric 126, the inner spacers 124, the isolation regions 118, and stop on the contact layer 114, as illustrated. Therefore, to produce the desired etch selectivity the first and second dielectric layers 116, 120 may include different dielectric materials than the gate dielectric 126, the inner spacers 124, and the isolation regions 118. It should be noted that the gate conductor 128 protrudes or extends above the heterostructure 102, and more specifically, above the contact layer 114. This height differential created by the removal of the first dielectric layer 116 may be directly responsible for the ability to fabricate self-aligned contacts as described below.

With continued reference to FIG. 8, a pair of outer spacers 132 (hereinafter "outer spacers 132") may be formed along opposite vertical sidewalls of the inner spacers 124 as illustrated. The outer spacers 132 may be formed by conformally depositing or growing a dielectric, followed by an anisotropic etch that removes the dielectric from the horizontal surfaces of the structure 100, for example a top surface of the gate cap 130, a top surface of the contact layer 114, and a top surface of the isolation regions 118, while leaving it on the sidewalls of the inner spacers 124. In one embodiment, the outer spacers 132 may include any suitable dielectric material, such as, for example, a nitride or an oxide. In one embodiment, the outer spacers 132 may include silicon nitride. In one embodiment, the outer spacers 132 may have a horizontal width, or thickness, ranging from about 5 nm to about 10 nm. Like the inner spacers 124, the outer spacers 132 may include a single layer or multiple layers of dielectric material. The outer spacers 132 may be positioned along the vertical sidewalls of the inner spacers 124, and may be used for forming fully self-aligned metal contacts in a source region or a drain region. It should be noted a pair of parasitic spacers 134 (hereinafter "parasitic spacers") may be formed at the same time as the outer spacers 132. The parasitic spacers 134 may be substantially similar to the outer spacers 132.

Figure 9:
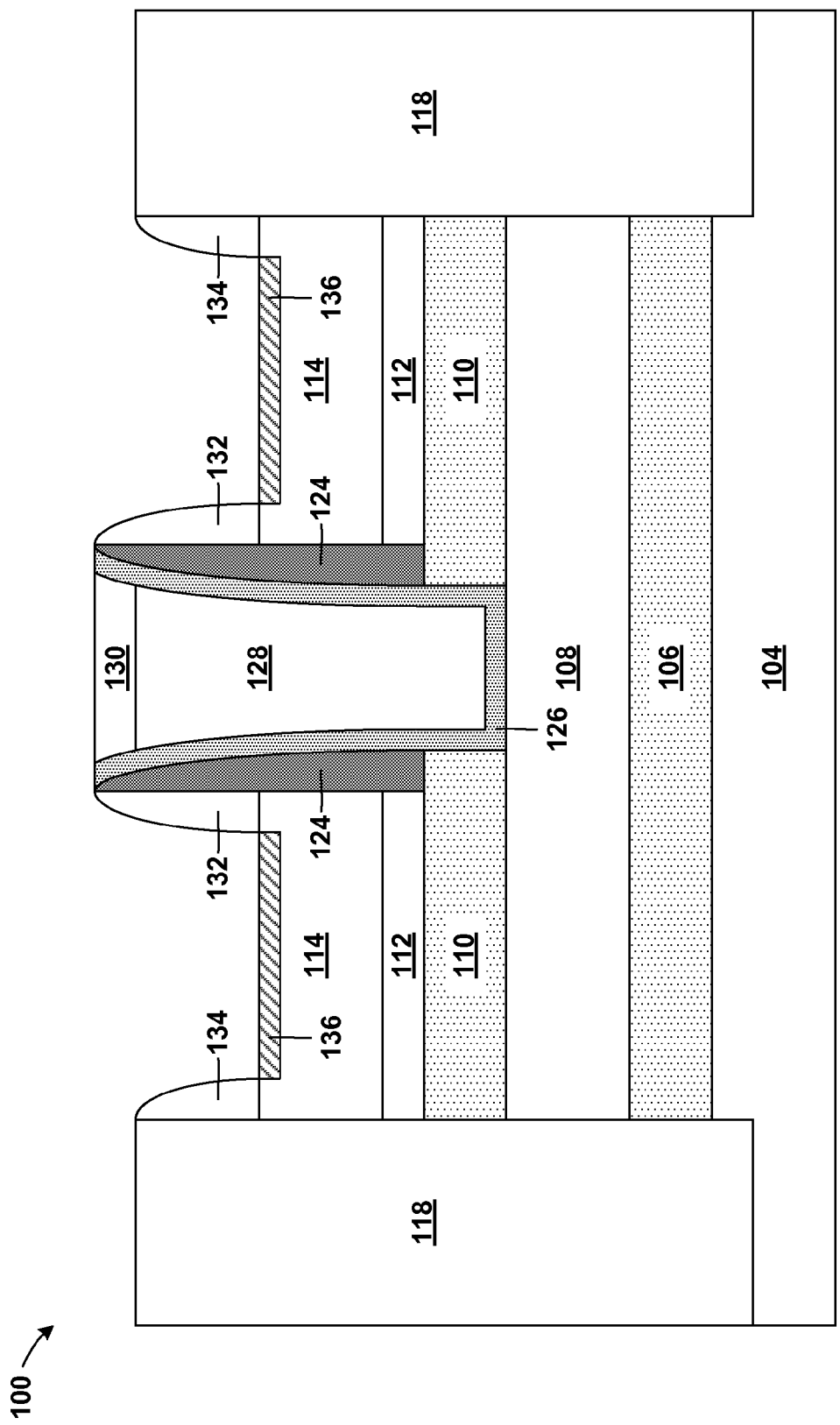
FIG. 9 is a cross-sectional view that illustrates the formation of fully self-aligned source-drain contacts according to an exemplary embodiment.

Referring now to FIG. 9, a pair of source-drain contacts 136 may be formed in an uppermost layer of the heterostructure 102. More specifically, the pair of source-drain contacts 136 may be formed in the contact layer 114 using any suitable technique known in the art. Suitable techniques may include contact metallization or epitaxial growth. In some cases, the source-drain contacts 136 may be recessed within the contact layer 114, as shown, or raised above the contact layer 114. In one embodiment, the source-drain contacts 136 may be formed, for example, by depositing a blanket metal layer (not shown) above the structure 100. A rapid thermal annealing technique may be applied to cause the metal from the blanket metal layer to react with the III-V atoms in the contact layer 114 to form a metal-III-V alloy. Un-reacted metal from the blanket metal layer may then be selectively removed using, for example, a wet etching technique.

In the present embodiment, the source-drain contacts 136 are self-aligned to the outer spacers 132 as illustrated in the figure. Self-aligned contacts (for example the source-drain contacts 136) allow for a tight device pitch, while reducing the alignment error inherent in current lithography techniques. It should be noted that the source-drain contacts 136 may alternatively be referred to as Ohmic contacts. In the present embodiment, it should be noted that the source-drain contacts 136 may be considered to be fully self-aligned to the gate conductor 128 because no patterning or lithography techniques were used to fabricate the source-drain contacts 136 adjacent to the gate conductor 128.

Figure 10:
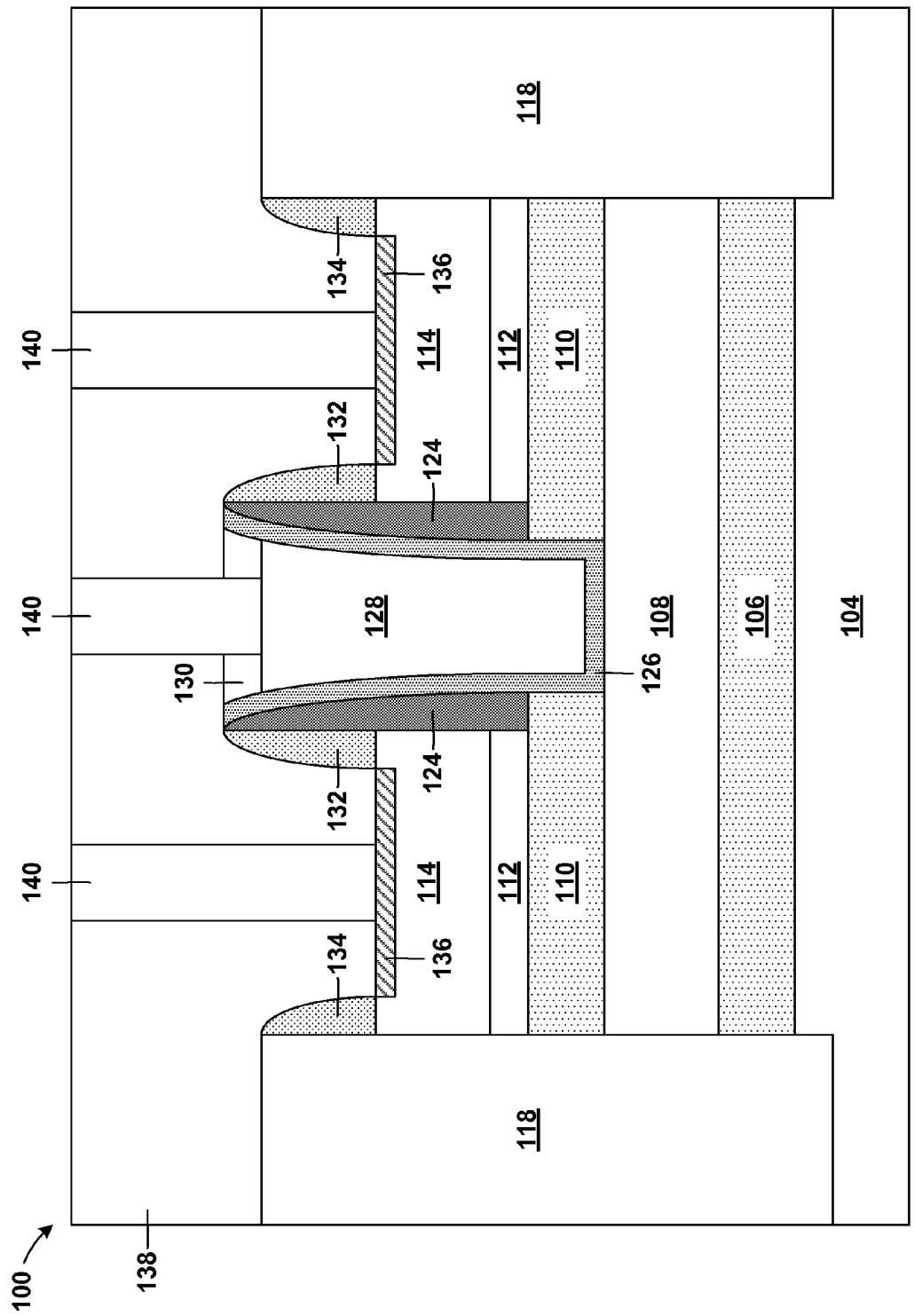
FIG. 10 is a cross-sectional view that illustrates the final structure after the formation of an inter-level dielectric layer and contact vias according to an exemplary embodiment.

Referring now to FIG. 10, an inter-level dielectric 138 may be deposited above the structure 100, in which one or more contact vias 140 may be formed therein. The inter-level dielectric 138 and the contact vias may be formed according to known techniques. As described in detail above, the source-drain contacts 136 may be fully self-aligned to the gate conductor 128 thereby allowing a smaller device footprint and increased device density. Furthermore, the distance between the source-drain contacts 136 and the gate conductor 128 may be determined by the thickness of the outer spacers 132. Therefore, the structure 100 is expected to have low external series resistance, which increases the FET drive current and the FET ac-switching speed.

As noted above, the source-drain contacts 136 of the present embodiment may be referred to as "self-aligned" due to the fact that they are fabricated and positioned adjacent to the gate conductor without any patterning or lithography. The structure 100 illustrated in the figure may be fabricated with a thicker contact layer 114, but the height differential between the contact layer and the top of the gate conductor is needed to produce the self-aligned contacts 136. Without that height differential, the source-drain contacts 136 could not otherwise be self aligned, and would require additional patterning or lithography to position and fabricate. In addition, a thicker contact layer 114 may increase the resistance between the contact layer 114 and the channel layer 108, thereby negatively affecting device performance. A thicker contact layer 114 may also increase overlap capacitance between the contact and the gate, thereby negatively affecting ac high-speed device performance.

Further, the structure 100 illustrated in the figures may be fabricated with a shorter gate, and also omitting the first dielectric layer 116; however, doing so will have similar detrimental effects as described above. Additionally, a shorter gate may increase gate resistance, thereby degrading alternate current (ac) high-speed device performance.

FIG. 10 illustrates the final structure 100 including a III-V semiconductor device having the gate conductor 128, the gate dielectric 126, and fully self-aligned source-drain contacts 136, as described above.

Figure 11:
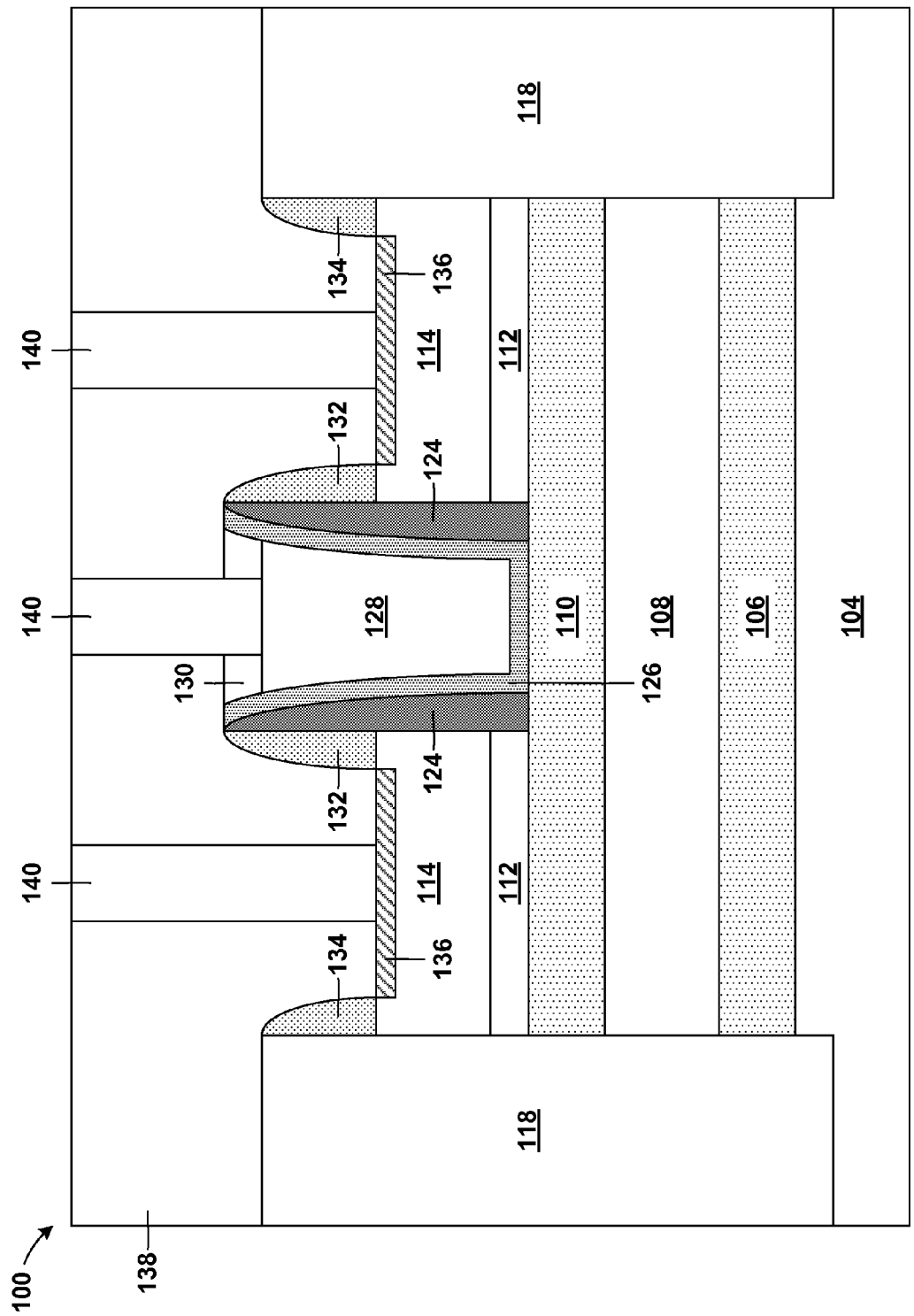
FIG. 11 is a cross-sectional view that illustrates a final structure according to another exemplary embodiment.

Referring now to FIG. 11, the structure 100 is illustrated according to an alternative embodiment. In the present embodiment, a portion of the barrier layer 110 may not be optionally removed, as described above with reference to FIG. 5 above. As such the gate dielectric 126 at the bottom of the gate trench 122 (FIG. 4) may be formed above the barrier layer 110. When the gate dielectric 126 is formed above the barrier layer 110, the barrier layer 110 may act as a gate dielectric as well. Since the barrier layer 110 is grown epitaxially on the channel 108, the interface-state density ($D_{it}$) at the channel to gate dielectric interface is reduced, which leads to improved sub-threshold device performance and improved device reliability.

Figure 12:
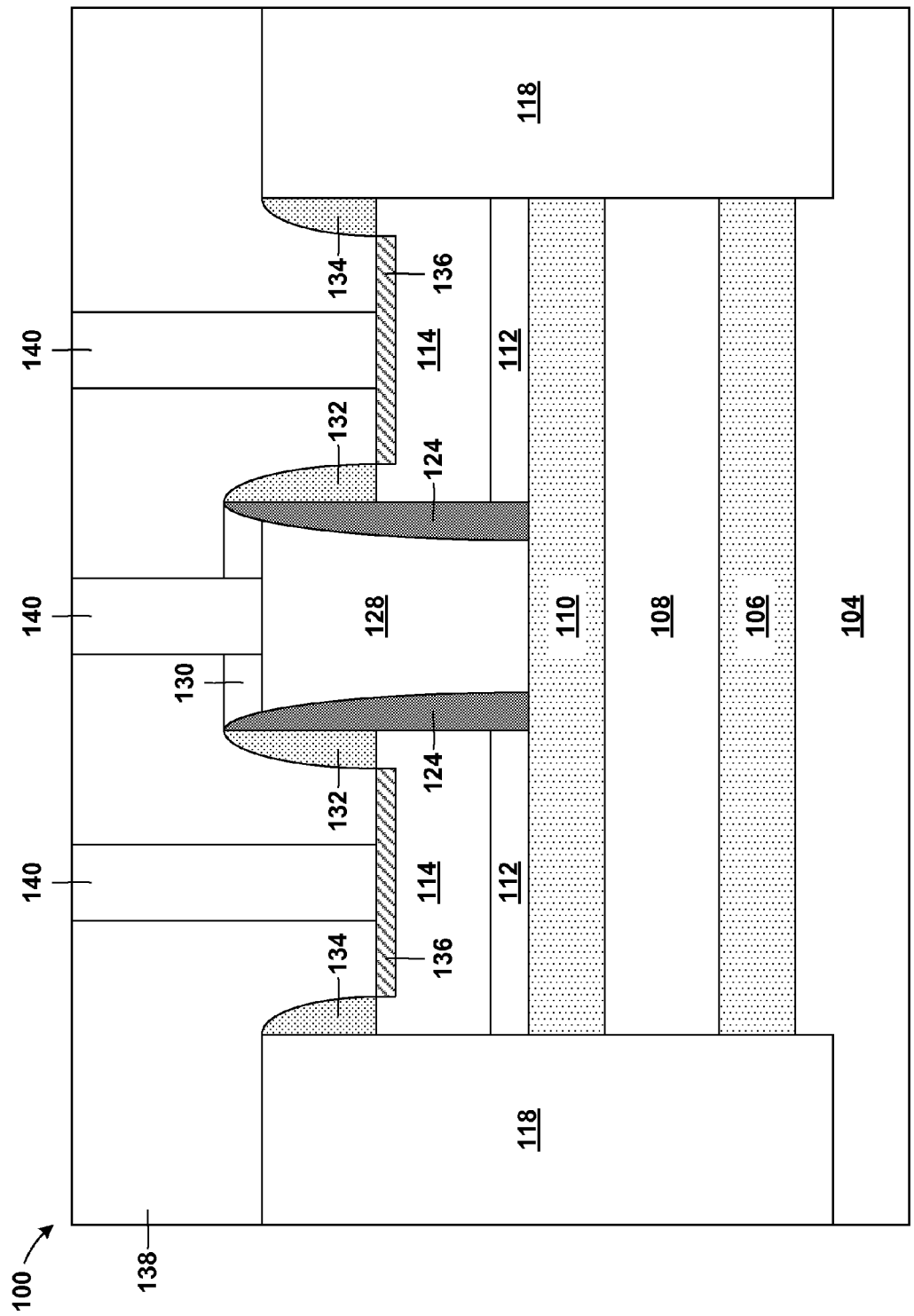
FIG. 12 is a cross-sectional view that illustrates a final structure according to another exemplary embodiment.

Referring now to FIG. 12, the structure 100 is illustrated according to an alternative embodiment. In the present embodiment, the final structure 100 may omit the gate dielectric 126 and include only a III-V semiconductor device having the gate conductor 128 and the fully self-aligned source-drain contacts 136, as described above. When the gate conductor 128 is formed directly on the barrier layer 110 by omitting the gate dielectric 126, the total gate capacitance is increased, which leads to higher device on-state current.

Figure 13:
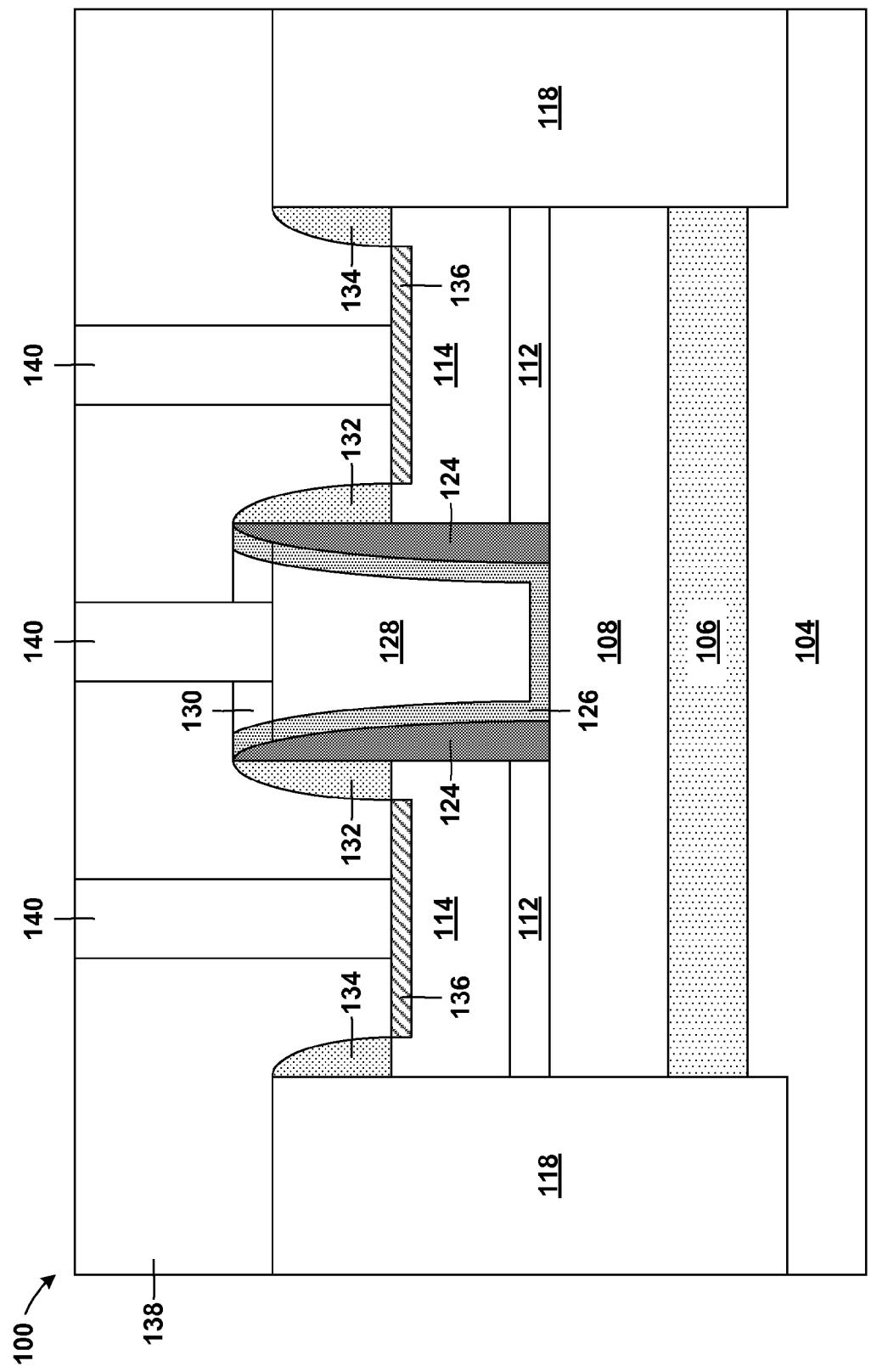
FIG. 13 is a cross-sectional view that illustrates a final structure according to another exemplary embodiment.

Referring now to FIG. 13, the structure 100 is illustrated according to an alternative embodiment. In the present embodiment, the final structure 100 may be fabricated without the barrier layer 110. As such the gate dielectric 126 at the bottom of the gate trench 122 (FIG. 4) may be formed above the channel layer 108. When the barrier layer 110, which acts like a gate dielectric, underneath the gate conductor 128 is omitted, the total gate capacitance is increased, which leads to higher device on-state current.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    a gate conductor partially embedded in a III-V compound semiconductor-containing heterostructure, the gate conductor extending from above the III-V compound semiconductor-containing heterostructure down into the III-V compound semiconductor-containing heterostructure;
    a pair of inner spacers positioned along a vertical sidewall of the gate conductor between the gate conductor and the III-V compound semiconductor-containing heterostructure;
    a pair of outer spacers adjacent to the pair of inner spacers above the III-V compound semiconductor-containing heterostructure, the outer spacers are in direct contact with and self-aligned to the inner spacers; and
    a pair of source-drain contacts positioned within the III-V compound semiconductor-containing heterostructure, the pair of source-drain contacts are self-aligned to the pair of outer spacers such that an edge of each individual source-drain contact is aligned with an outside edge of each individual outer spacer.

2. The structure of claim 1, wherein the III-V compound semiconductor-containing heterostructure comprises:
    a III-V compound semiconductor buffer layer on an upper surface of a substrate;
    a III-V compound semiconductor channel layer on an upper surface of the III-V compound semiconductor buffer layer;
    a III-V compound semiconductor barrier layer on an upper surface of the III-V compound semiconductor channel layer; and
    a III-V compound semiconductor cap layer on an upper surface of the III-V compound semiconductor barrier layer.

3. The structure of claim 1, wherein the pair of source-drain contacts are positioned in an uppermost layer of the III-V compound semiconductor-containing heterostructure.

4. The structure of claim 1, wherein the gate conductor extends from above the III-V compound semiconductor-containing heterostructure down to a channel layer within the III-V compound semiconductor-containing heterostructure.

5. The structure of claim 1, wherein the gate conductor extends from above the III-V compound semiconductor-containing heterostructure down to a barrier layer within the III-V compound semiconductor-containing heterostructure.

6. The structure of claim 1, further comprising:
   a gate dielectric positioned along a bottom and opposite sides of the gate conductor, the gate dielectric located between the gate conductor and the III-V compound semiconductor-containing heterostructure.

7. The structure of claim 1, further comprising:
   an isolation region separating the gate conductor and the source-drain contacts from an adjacent gate conductor or an adjacent source-drain contact; and
   a pair of parasitic spacers in direct contact with and self-aligned to the isolation region.

* * * * *